United States Patent
Ramakrishnan et al.

(10) Patent No.: US 11,569,827 B1
(45) Date of Patent: Jan. 31, 2023

(54) ANALOG-TO-DIGITAL CONVERTOR PSEUDO PERIODIC IL ESTIMATION

(71) Applicant: TEXAS INSTRUMENTS INCORPORATED, Dallas, TX (US)

(72) Inventors: Sthanunathan Ramakrishnan, Bangalore (IN); Nithin Gopinath, Bangalore (IN); Sai Aditya Nurani, Hyderabad (IN); Joseph Palackal Mathew, Kerala (IN); Nagalinga Swamy Basayya Aremallapur, Ranebennur (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/390,362

(22) Filed: Jul. 30, 2021

(51) Int. Cl.
  *H03M 1/06* (2006.01)
  *H03M 1/12* (2006.01)
  *H03M 1/08* (2006.01)
  *H03M 1/10* (2006.01)

(52) U.S. Cl.
  CPC ........ *H03M 1/0607* (2013.01); *H03M 1/0626* (2013.01); *H03M 1/08* (2013.01); *H03M 1/1009* (2013.01); *H03M 1/121* (2013.01); *H03M 1/124* (2013.01)

(58) Field of Classification Search
  CPC ...... H03M 1/0607; H03M 1/121; H03M 1/08; H03M 1/1009; H03M 1/124; H03M 1/0626
  See application file for complete search history.

(56) References Cited

U.S. PATENT DOCUMENTS

| | | |
|---|---|---|
| 9,160,358 B2 | 10/2015 | Ramakrishnan et al. |
| 9,184,762 B2 | 11/2015 | Ramakrishnan et al. |
| 2020/0343899 A1* | 10/2020 | Wu ..................... H03M 1/1215 |

* cited by examiner

*Primary Examiner* — Joseph J Lauture
(74) *Attorney, Agent, or Firm* — Valerie M. Davis; Frank Cimino

(57) ABSTRACT

Aspects of the description provide for an analog-to-digital converter (ADC) operable to convert an analog input signal to an output signal at an output of the ADC. In some examples, the ADC includes multiple sub-ADCs coupled in parallel, each of the multiple sub-ADCs coupled to the output of the ADC and operable to receive the analog input signal. The ADC is configured to operate the sub-ADCs in a consecutive operation loop including a transition phase in which the ADC operates each of the sub-ADCs sequentially for a first number of sequences, an estimation phase in which the ADC operates each of the sub-ADCs sequentially for a second number of sequences following the first number of sequences, and a randomization phase in which the ADC operates subsets of the sub-ADCs for a third number of sequences following the second number of sequences.

20 Claims, 4 Drawing Sheets

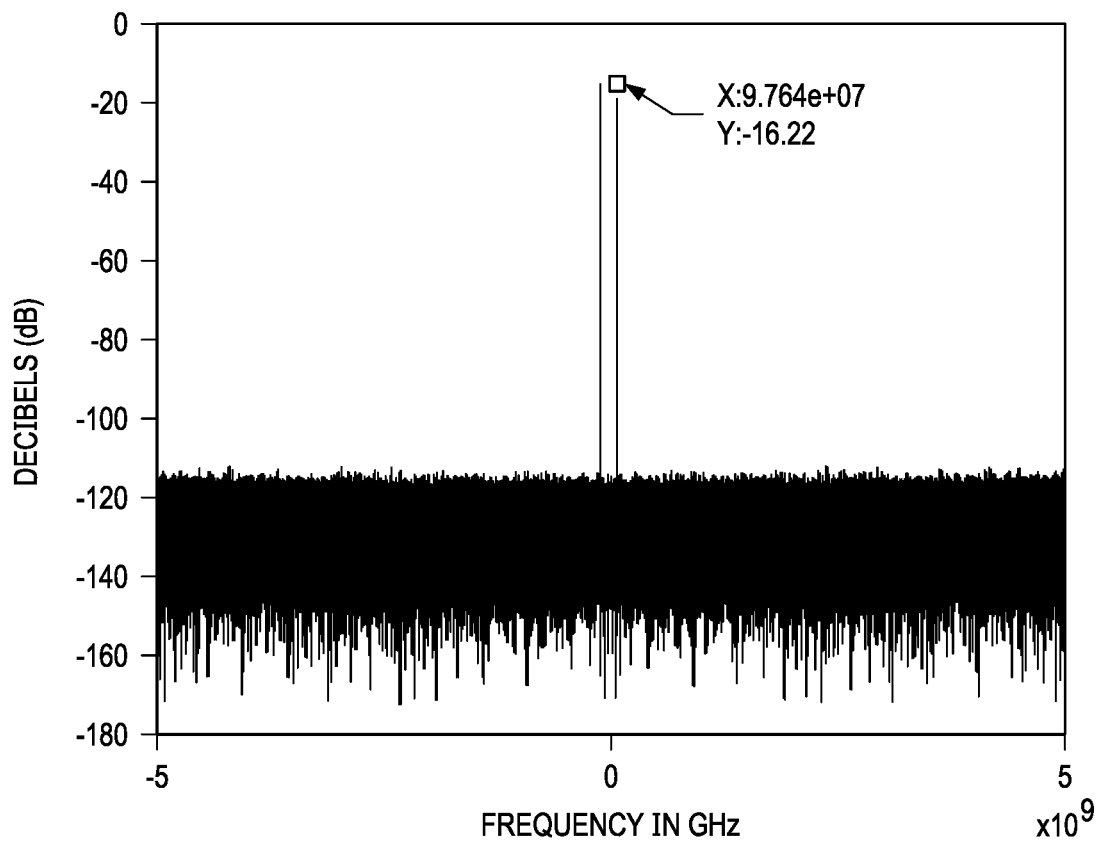

US 11,569,827 B1

ANALOG-TO-DIGITAL CONVERTOR PSEUDO PERIODIC IL ESTIMATION

BACKGROUND

Analog-to-digital converters (ADCs) with high sampling rates are becoming more prevalent, such as in multi-Gigabit communication systems (e.g. wireless infrastructure systems), radar systems, etc. Such systems may operate in frequency bands of about 1-4 gigahertz, or greater. One approach for implementing a high sampling rate ADC is to use a time-interleaved architecture with multiple sub-ADCs coupled in parallel, where each of the sub-ADCs may have a sampling rate less than the sampling rate of the full time-interleaved architecture.

SUMMARY

Aspects of the description provide for an ADC operable to convert an analog input signal to an output signal at an output of the ADC. In some examples, the ADC includes multiple sub-ADCs coupled in parallel, each of the multiple sub-ADCs coupled to the output of the ADC and operable to receive the analog input signal. The ADC is configured to operate the sub-ADCs in a consecutive operation loop including a transition phase in which the ADC operates each of the sub-ADCs sequentially for a first number of sequences, an estimation phase in which the ADC operates each of the sub-ADCs sequentially for a second number of sequences following the first number of sequences, and a randomization phase in which the ADC operates subsets of the sub-ADCs for a third number of sequences following the second number of sequences.

Other aspects of the description provide for a method for operating an ADC. In some examples, the method includes controlling multiple parallel-coupled sub-ADCs to operate sequentially and periodically for a first number of sequences, and controlling subsets of the sub-ADCs to operate for a second number of sequences, the second number being a randomly selected number.

Other aspects of the description provide for a receiver. In some examples, the receiver includes an input, an output, a time-interleaved ADC having an input coupled to the input of the receiver and an output coupled to the output of the receiver. The time-interleaved ADC includes multiple sub-ADCs coupled in parallel. The time-interleaved ADC is configured to control the sub-ADCs to operate sequentially and periodically in a periodic phase for a first number of sequences, and control a subset of the sub-ADCs to operate in a randomization phase for a second number of sequences, the second number being a randomly selected number.

BRIEF DESCRIPTION OF THE DRAWINGS

FIG. 6 is a frequency versus amplitude diagram of an ADC output signal, in accordance with various examples.

The same reference numbers (or other feature designators) are used in the drawings to designate the same or similar (functionally and/or structurally) features.

DETAILED DESCRIPTION

Figure 3:
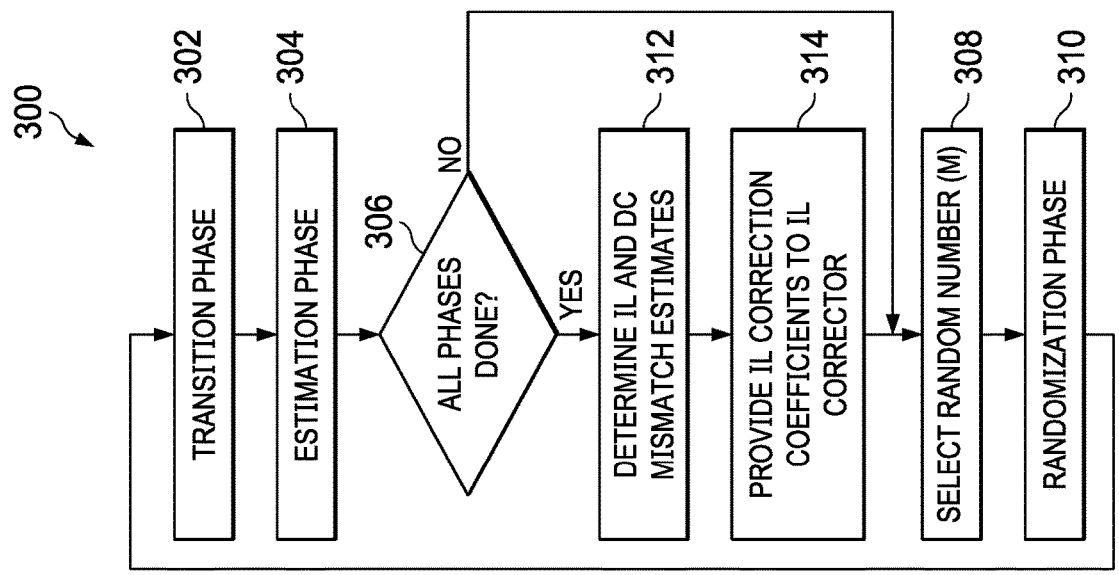
FIG. 3 is a flowchart of a method, in accordance with various examples.

As described above, multiple ADCs (e.g., "sub-ADCs") may be coupled in parallel and controlled in a time-interleaved manner to function as an ADC having a higher sampling rate than the sub-ADCs do individually. However, mismatches, such as direct current (DC) offset and time interleaving (IL) mismatches may occur between, or among, the sub-ADCs, adversely affecting operation of the ADC. Some conventional compensation schemes exist to compensate for the mismatches, but these conventional compensation schemes may each include trade-offs or characteristics that provide less than optimal performance of the ADC. For example, the IL mismatch may be dependent on a sequence of sub-ADCs selected for operation. In a conventional randomized interleaving control method, while some effects of the IL mismatch may be mitigated, at least some aspects would not be mitigated due to the memory dependence (e.g., dependence on a sequence of sub-ADCs selected) of the IL mismatch.

Aspects of this description provide for a randomly interspersed pseudo periodic (RIPP) ADC. In at least some examples, the RIPP ADC includes N sub-ADCs and operates in at least three phases, where N is any suitable positive integer value. In a first phase, which may be a transition phase, the RIPP ADC operates the sub-ADCs sequentially. For example, the RIPP ADC may operate the sub-ADCs in a sequential order of sub-ADC[0], sub-ADC[1], sub-ADC [N-1]. This sequential order of operation may be repeated k times, where k is any suitable positive integer value. In at least some examples, k may be selected from a range of 0 to [N-1]. The transition phase, in at least some examples, may facilitate settling of the sub-ADCs, such as between operation in other phases.

In a second phase, which may be an estimation phase, the RIPP ADC may continue to operate the sub-ADCs sequentially. In at least some examples, the sequential order of operation may be repeated Nr times, where Nr is any suitable positive integer value. In at least some examples, Nr is determined based on a number of signal samples for use in IL estimation. For example, for an X-point fast Fourier transform (FFT) for use in IL estimation, Nr may have a value such that Nr*N≥X. The estimation phase, in at least some examples, may be periodic in a manner that facilitates estimation of the IL mismatch. In at least some examples, because the sequence of operation of the sub-ADCs is unchanged in the estimation phase, complexity of estimating the IL mismatch may be reduced in comparison to other compensation techniques (such as randomized interleaving), in which the sequence of operation of the sub-ADCs may be changed.

In the third phase, which may be a randomization phase, a constrained random number may be selected and selection of sub-ADCs for operation may be shifted according to the constrained random number. For example, a constrained random number M may be selected at random from an index, and the RIPP ADC may operate a sequential order of sub-ADC[0], sub-ADC[1], sub-ADC [N-2] for M number of sequences. In another example, M may be selected at random from the index, and the RIPP ADC may operate a subset of sub-ADC [0], sub-ADC [1], ... sub-ADC [N-2] for M number of sequences, where at least some members of the subset may change from one sequence to another sequence.

In this way, a phase of a sampling clock received by each of the sub-ADCs may be randomized. In at least some examples, M is removed (e.g., deleted) from the index after selection, or after the RIPP ADC operates the sequential order of sub-ADC [0], sub-ADC [1], . . . sub-ADC [N-2] for M number of sequences. In at least some examples, the RIPP ADC may continue cycling through the transition phase, the estimation phase, and the randomization phase in a repeated and sequential manner until the numbers of the index have been exhausted (e.g., all values have been removed from the index). In some examples, the transition phase may be omitted such that the RIPP ADC may continue cycling through the estimation phase and the randomization phase in a repeated and sequential manner until the numbers of the index have been exhausted. In at least some examples, following exhaustion of the index, each sub-ADC may have been exposed to each phase of the sampling clock such that the DC offset may be estimated. Based on the estimated DC offset and IL mismatches, the sub-ADCs may be corrected to improve performance of the ADC.

Figure 1:
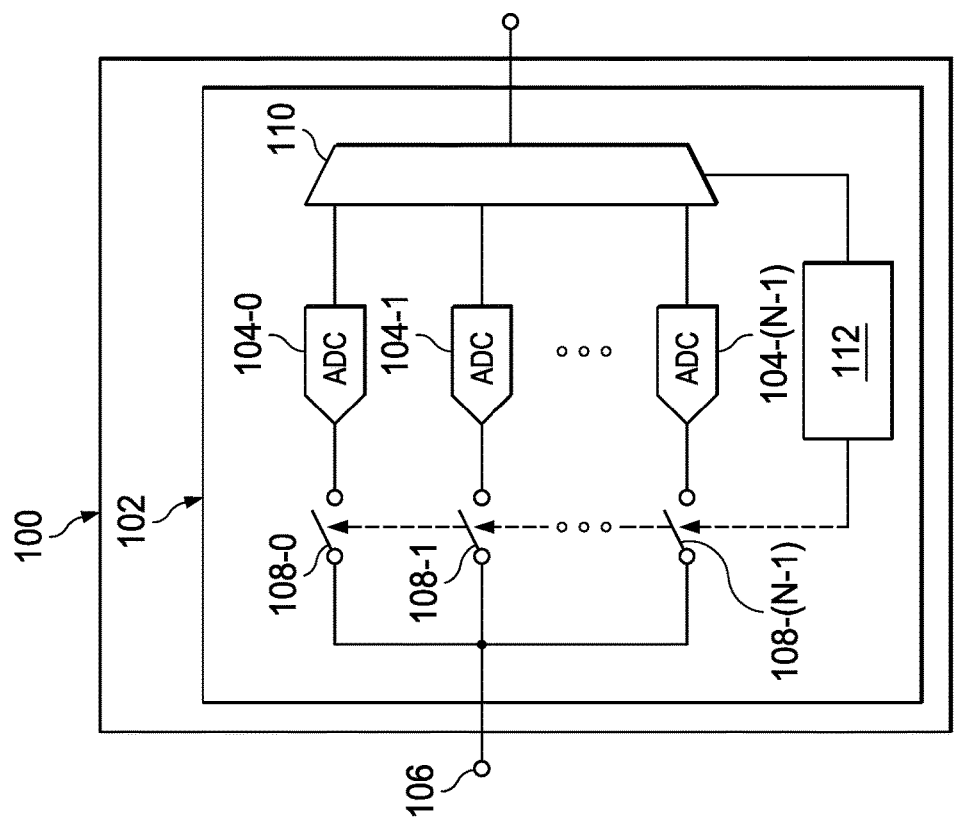
FIG. 1 is a block diagram of a receiver, in accordance with various examples.

FIG. 1 is a block diagram of a receiver 100, in accordance with various examples. In at least some examples, the receiver 100 includes an ADC 102. The ADC 102 may have a time-interleaved architecture such that the ADC 102 includes N sub-ADCs coupled in parallel (e.g., sub-ADCs 104-0, 104-1, . . . 104-(N-1). In at least some examples, each respective sub-ADC 104 is coupled to an input terminal 106 via a corresponding switch 108 (e.g., switch 108-0 couples an input of the sub-ADC 104-0 to the input terminal 106, switch 108-1 couples an input of the sub-ADC 104-1 to the input terminal 106, etc.). Each respective switch 108 may be configured to receive a clock signal, a delayed instance of a clock signal, or any other suitable control signal provided by a controller 112 such that the switches 108 may be controlled to cause only one of the sub-ADCs 104 to receive an input signal provided at the input terminal 106 at a given time.

In some examples, the ADC 102 may also include a multiplexer 110. The multiplexer 110 may be a N-to-1 multiplexer that combines outputs of each of the sub-ADCs 104 to form an output signal of the ADC 102 according to a control signal provided by the controller 112. For example, based on the control signal provided by the controller 112, the multiplexer 110 selects one of the outputs of the sub-ADCs 104 for output to combine the outputs of the sub-ADCs 104 to form a time-interleaved output of the ADC 102. In other examples, the ADC 102 may not include the multiplexer 110 and instead the ADC 102 may provide output signals of each of the sub-ADCs 104 as output signals of the ADC 102. In some examples, the ADC 102 may not include the multiplexer 110 and instead the controller 112 may receive the output signals of each of the sub-ADCs 104 and provide an output signal of the ADC 102 based on the output signals of each of the sub-ADCs 104. The controller 112 may estimate and/or determine the IL mismatch and/or the DC offset between, or among, the sub-ADCs 104, such as described elsewhere herein. To perform the estimation, in some examples, the controller 112 may receive output signals of each of the sub-ADCs 104 (connections not expressly shown). In other examples, to perform the estimation, the controller 112 may receive an output of the multiplexer 110 prior to output by the ADC 102, in which case the controller 112 may provide the output of the ADC 102. Based on the estimated IL mismatch and/or the DC offset, the controller 112 may apply correction to the sub-ADCs, such as via a mismatch weighting profile, multiplication, addition, and/or subtraction of any suitable signals in the ADC 102, analog trimming of a sampling clock of the ADC 102, etc.

Figure 2:
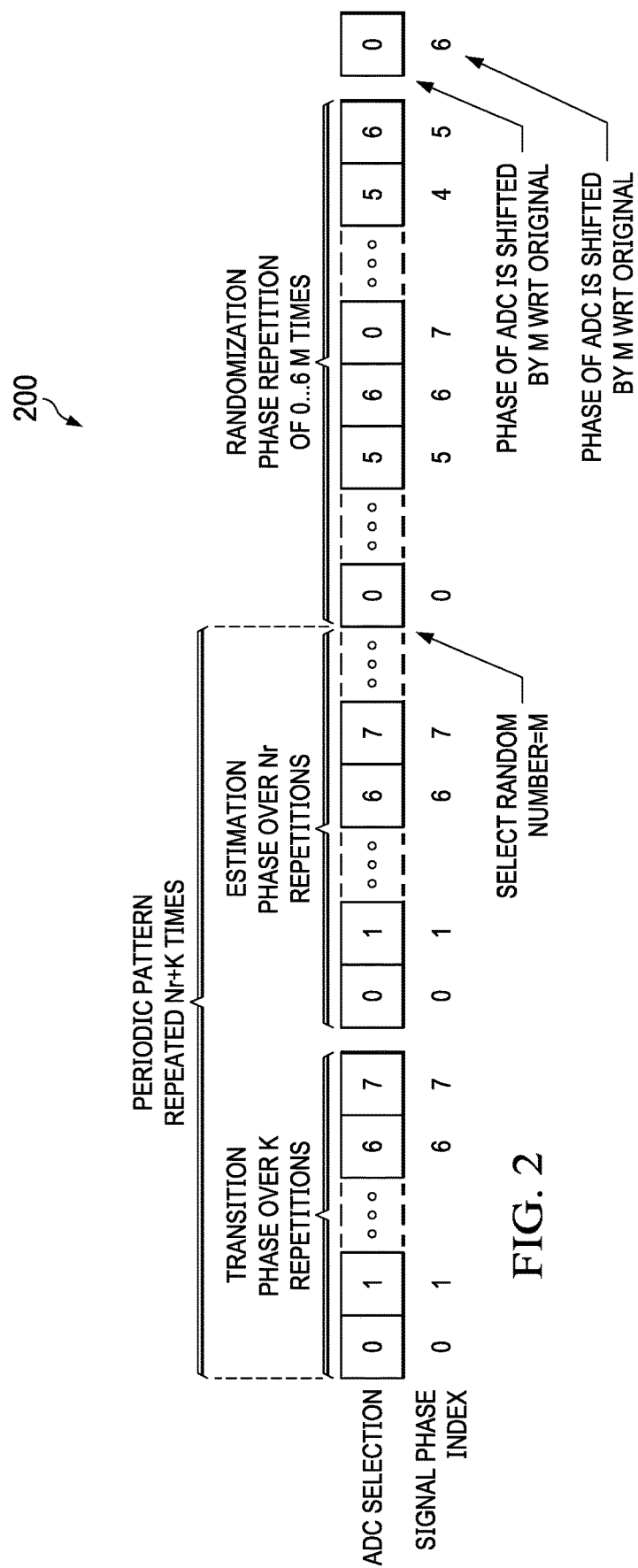
FIG. 2 is a diagram of a mapping of sub-ADCs to phases of a sampling clock, in accordance with various examples.

FIG. 2 is a diagram 200 that maps sub-ADCs to phases of a sampling clock, in accordance with various examples. In at least some examples, the diagram 200 is applicable to operation of the ADC 102 and sub-ADCs 104 of FIG. 1. Accordingly, reference may be made to components and/or signals of FIG. 1 in describing FIG. 2. The diagram 200 shows phases of operation of the ADC 102 with a mapping between sub-ADCs 104 and a phase of a signal received by each of those respective sub-ADCs 104. As described above, the ADC 102 may operate in at least three phases—a transition phase and an estimation phase, each of which may be periodic and include each sub-ADC 104, and a randomization phase. The transition phase and the estimation phase may each be periodic in nature such that they may be collectively referred to as a periodic phase. For example, the ADC 102 may operate the sub-ADCs 104 consecutively, sub-ADC 104-0, sub-ADC 104-1, . . . sub-ADC 104-(N-1) for K repetitions in the transition phase and Nr repetitions in the estimation phase, as described above. The randomization phase may be periodic in nature for a subset of the sub-ADCs 104. For example, the ADC 102 may operate sub-ADC 104-0, sub-ADC 104-1, . . . sub-ADC 104-(N-2) consecutively for M repetitions, as described above, prior to returning to the transition phase. Each of these three phases is shown in the diagram 200.

As described above, the ADC 102 may control the sub-ADCs 104 to operate consecutively by controlling respective switches 108. As shown by the diagram 200, in the periodic phase, a phase of the sampling clock (e.g., the clock by which the switches 108 are controlled) corresponds to a position of a sub-ADC 104 sampling an input signal. For example, sub-ADC 104-0 sees (e.g., receives) phase 0 of the sampling clock, sub-ADC 104-1 sees (e.g., receives) phase 1 of the sampling clock, . . . and sub-ADC 104-(N-1) sees (e.g., receives) phase (N-1) of the sampling clock. For the example embodiment depicted in FIG. 2, ADC 102 includes eight sub-ADCs 104 (e.g. N=8). The sub-ADCs are referred to in FIG. 2 as 0 (e.g. 104-0), 1 (e.g. 104-1), 2 (e.g. 104-2) . . . 7 (e.g. 104-7). In this example embodiment, if the sampling frequency of ADC 102 is around 10 gigasamples per second (Fs=10 GSPS), each sub-ADC may operate at frequency less than Fs (e.g. Fs/7).

However, in such a purely periodic approach challenges may exist at frequencies of Fs/N, where Fs is a frequency of the sampling clock. Therefore, the randomization phase randomizes which sub-ADC 104 sees which phase of the sampling clock.

For example, M may be selected from a constrained list such that M is a constrained random number. For example, M may be selected at random from an index of values [0:(N-1)]. For M repetitions, the ADC 102 may then control the switches 108 such that a subset of the sub-ADCs 104 receive the input signal. For example, the ADC 102 may control the switches 108 such that the sub-ADC 104-0, sub-ADC 104-1, . . . and sub-ADC 104-(N-2) receive the input signal consecutively for M repetitions (or sequences, if each sequence is not an exact repetition). In this way, a phase of the sampling clock seen by a given sub-ADC 104 is shifted by M by an end of the repetition phase with respect to the phase of the sampling clock seen by the same sub-ADC 104 during the periodic phase. Subsequent to completion of the Mth repetition, the value M may be removed from the index and operation may return to the transition phase. This looping, iterative operation may continue until all values in the index are exhausted. In at least some examples, all values in the index being exhausted (e.g., the index being empty because all values have been removed) indicates that each sub-ADC 104 of the ADC 102 has seen each phase of the sampling clock. In at least some examples, the randomization phase, providing that each sub-ADC 104 sees each phase of the sampling clock, randomizes residual IL spurs in an output of the ADC 102 and prevents effects of the input signal of the ADC 102 on IL mismatch estimation (e.g., such as signals having frequencies at multiples of approximately Fs/2N).

The foregoing describes an example in which the ADC 102 as controlling the switches 108 such that the sub-ADC 104-0, sub-ADC 104-1, . . . and sub-ADC 104-(N-2) receive the input signal and the sub-ADC 104-(N-1) is omitted from operation. However, in other examples, other combinations of control may be possible. For example, sub-ADC 104-(M) may be omitted from operation in the randomization phase, different sub-ADCs 104 may be omitted in each repetition of the randomization phase, or any other suitable one of the sub-ADCs 104 may be omitted from operation for a sequence, or multiple sequences, of the randomization phase.

In at least some examples, periodic IL mismatch and DC offset are estimated based on the samples obtained during the estimation phase, as described elsewhere herein. Based on the estimations, the IL mismatch and/or DC offset may be corrected, such as by weighting some of the sub-ADCs 104 differently than other of the sub-ADCs 104. Also, timing mismatches may be corrected by controlling analog trims to control a rising edge of the sampling clock. In at least some examples, correction of the IL mismatch and/or DC offset estimated according to the alternating periodic and randomization phases may reduce a value of residual IL spurs in the output of the ADC 102 to be approximately equal to, or less than, a value of the noise floor of the output signal of the ADC 102. The noise floor of the output signal of the ADC 102 may be a sum of noise sources affecting the ADC 102.

FIG. 3 is a flowchart of a method 300 for ADC operation, in accordance with various examples. In at least some examples, the method 300 is applicable to operation of the ADC 102 and sub-ADCs 104 of FIG. 1. For example, the ADC 102 and at least some of the sub-ADCs 104 may be controlled, such as by the controller 112 or another component or device communicating with the controller 112, based on the method 300 to estimate and/or correct IL and/or DC offset mismatches among the sub-ADCs 104. Accordingly, reference may be made to components and/or signals of FIG. 1 in describing FIG. 3.

At operation 302, the ADC 102 operates in a transition phase. During the transition phase, IL estimation for the ADC 102 may be disabled. Also during the transition phase, the ADC 102 may control the sub-ADCs 104 (or the switches 108), such as via the controller 112, to operate each of the sub-ADCs 104 in a periodic and sequential manner for K repetitions. For example, the ADC 102 may control the sub-ADCs 104 to operate in a sequence of {104-0, 104-1, . . . 104-(N-1)} for K repetitions (e.g., in some example embodiments, K=1) of the sequence. Following completion of the Kth repetition, the method 300 may proceed to operation 304. In at least some examples, operation 302 may be omitted such that the method 300 begins at operation 304.

At operation 304, the ADC 102 operates in an estimation phase. During the estimation phase, IL estimation for the ADC 102 may be enabled. The IL estimation may be periodic IL estimation. Accordingly, during the estimation phase, the ADC 102 may continue to control the sub-ADCs 104 (or the switches 108) to operate each of the sub-ADCs 104 in a periodic and sequential manner for Nr repetitions. For example, the ADC 102 may control the sub-ADCs 104 to operate in a sequence of {104-0, 104-1, . . . 104-(N-1)} for Nr repetitions of the sequence. Following completion of the Nrth repetition, the method 300 may proceed to operation 306.

At operation 306, the ADC 102 determines whether all signal phases of the sampling clock have been seen by each sub-ADC 104. In some examples, the ADC 102 may make the determination by determining whether any values remain in an index set, as described above. If the ADC 102 determines that all signal phases of the sampling clock have not been seen by each sub-ADC 104 (e.g., if the index set is not empty), the ADC 102 retains the index set and the method 300 proceeds to operation 308.

At operation 308, M (e.g., a random number, as described above) is selected. In at least some examples, M is selected from the index set such that M is a constrained random number, constrained by the index set. In some examples, after selecting M, the method 300 proceeds to operation 310. In other examples, after selecting M, the value M may be removed from the index set and the method 300 proceeds to operation 310.

At operation 310, a subset of the sub-ADCs 104 are operated in M consecutive sequences. In some examples, the subset of the sub-ADCs 104 may be the same for each of the M sequences. In other examples, the subset of the sub-ADCs 104 may change between at least some of the M sequences. In at least some examples, the subset of the sub-ADCs 104 may be sub-ADC 104-0 . . . sub-ADC 104-(N-2) (as depicted in FIG. 2 where sub-ADC 104-7, shown as "7" in the "ADC SELECTION" row, is not utilized in the randomization phase). In other examples, the subset of the sub-ADCs 104 may be any N-2 of the sub-ADCs 104. In other examples, the subset of the sub-ADCs 104 may be any N-X of the sub-ADCs 104, where X is any suitable integer value in [1:N]. In examples in which M was not removed from the index set prior to proceeding to operation 310, following completion of the Mth sequence, the value M may be removed from the index set and the method 300 returns to operation 302.

Returning to operation 306, if the ADC 102 determines that all signal phases of the sampling clock have been seen by each sub-ADC 104 (e.g., if the index set is empty), the method 300 proceeds to operation 312.

At operation 312, the IL mismatch and/or DC offset for the sub-ADCs 104 are estimated. In at least some examples, the IL and the DC offset mismatch are each estimated according to any suitable periodic calculation that may be parameter or non-parameter based, the scope of which is not limited herein. The DC offset estimation may be averaged within a signal phase, as well as across signal phases. In at least some examples, averaging the DC offset estimation across signal phases may cause the DC offset to appear similar to signal noise, averaging to a value of approximately zero. Following estimation of the IL mismatch and/or DC offset, the method 300 proceeds to operation 314.

At operation 314, correction coefficients are provided to a corrector. In at least some examples, the corrector is a component of the controller 112. In other examples, the corrector is a separate hardware component. The correction coefficients may be, for example, based on the estimates determined at operation 312. Following the operation of providing of the correction coefficients to the corrector, the index set is set or re-initialized to include the integers in the range of [0:N-1] and the method 300 proceeds to operation 308. The corrector may apply correction to any one or more signals in the ADC 102 according to any suitable process or processes based on the correction coefficients, the scope of which is not limited herein.

Figure 4:
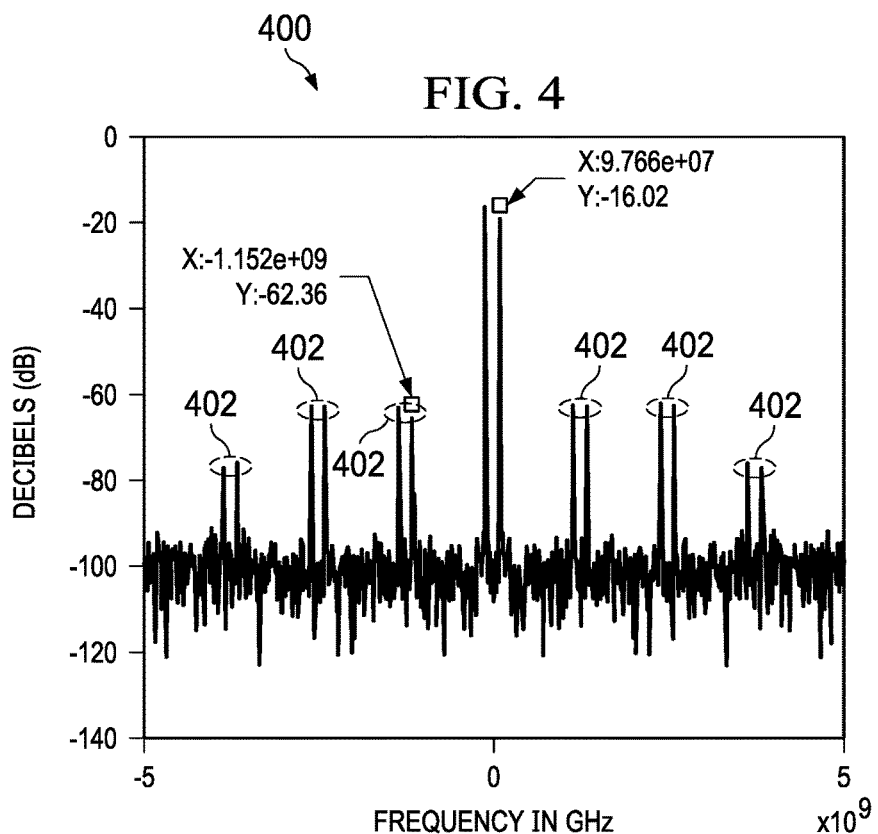
FIG. 4 is a frequency versus amplitude diagram of an ADC output signal, in accordance with various examples.

FIG. 4 is a frequency versus amplitude diagram 400 that shows an ADC output signal. In at least some examples, the diagram 400 shows an example of an output signal of the ADC 102 in the absence of the randomization phase, described herein. The diagram 400 includes a horizontal axis representative of frequency in units of gigahertz (GHz) (where 0 represents the frequency of the desired output signal of ADC 102) and a vertical axis representative of a FFT value (in decibels) of the output signal of the ADC. The diagram 400 shows that the output signal of the ADC 102 in the absence of the randomization phase, described herein, includes residual IL spurs 402 having values of up to approximately −62 decibels (dB).

Figure 5:
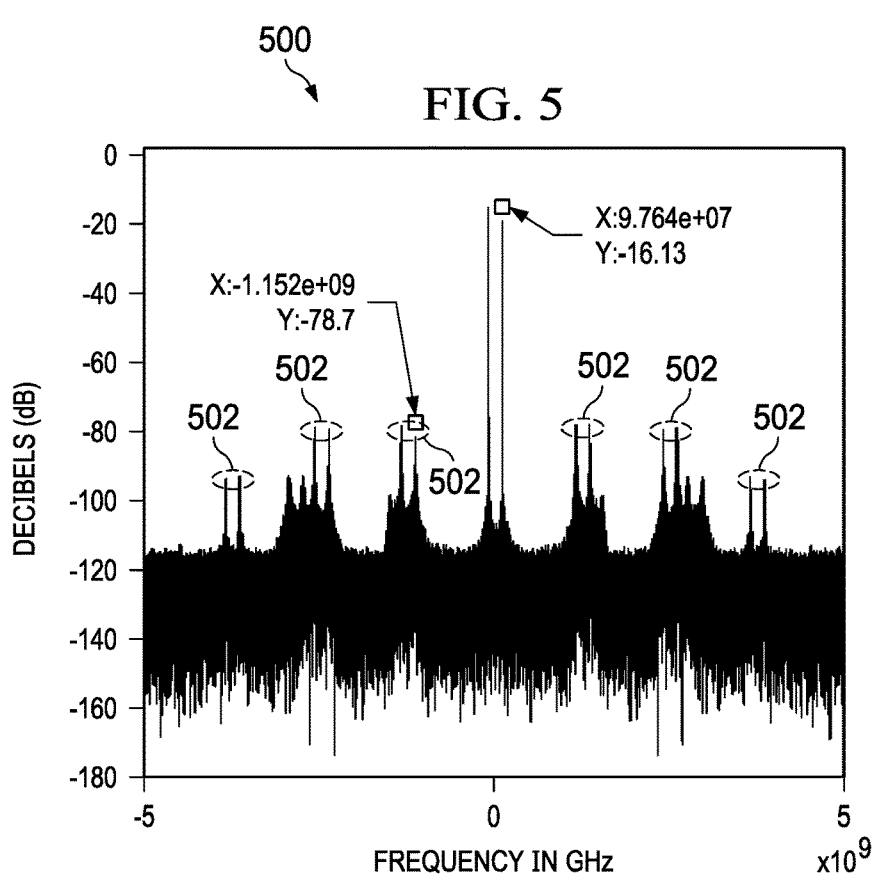
FIG. 5 is a frequency versus amplitude diagram of an ADC output signal, in accordance with various examples.

FIG. 5 is a frequency versus amplitude diagram 500 that shows an ADC output signal. In at least some examples, the diagram 500 shows an example of an output signal of the ADC 102, such that providing of the output signal of the ADC includes implementation of the randomization phase, described herein. The diagram 500 includes a horizontal axis representative of frequency in units of gigaHz (where 0 represents the frequency of the desired output signal of ADC 102) and a vertical axis representative of a FFT value (in decibels) of the output signal of the ADC. The diagram 500 shows that the output signal of the ADC 102, including implementation of the randomization phase, described herein, includes residual IL spurs 502 having values of up to approximately −78 dB. Thus, implementation of the randomization phase described herein suppresses the residual IL spurs 502 by approximately 16 dB, as shown by comparing the diagram 500 to the diagram 400.

FIG. 6 is a frequency versus amplitude diagram 600 that shows an ADC output signal. In at least some examples, the diagram 600 shows an example of an output signal of the ADC 102, such that providing of the output signal of the ADC includes implementation of the randomization phase, described herein, and correction for an estimated IL mismatch. The diagram 600 includes a horizontal axis representative of frequency (where 0 represents the frequency of the desired output signal of ADC 102) in units of GHz and a vertical axis representative of a FFT value (in decibels) of the output signal of the ADC. The diagram 600 shows that the output signal of the ADC 102, including implementation of the randomization phase and IL mismatch correction, each as described herein, includes residual IL spurs having values approximately the same, or less than, that of a noise floor of the output signal of the ADC. Thus, implementation of the randomization phase and correction for the IL mismatch, each as described herein, effectively suppresses the residual IL spurs to levels indiscernible from noise present in the output signal of the ADC.

In this description, the term "couple" may cover connections, communications or signal paths that enable a functional relationship consistent with this description. For example, if device A provides a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more elements may instead include only semiconductor elements within a single physical device (e.g., a semiconductor die and/or integrated circuit (IC) package) and may be adapted to be coupled to at least some other of the elements to form the described structure either at a time of manufacture or after a time of manufacture, for example, by an end-user and/or a third-party. Circuits described herein are reconfigurable to include the replaced components to provide functionality at least partially similar to functionality available prior to the component replacement.

While certain components may be described herein as being of a particular type, these components may be exchanged for components of other process technologies. Circuits described herein are reconfigurable to include the replaced components to provide functionality at least partially similar to functionality available prior to the component replacement. Unless otherwise stated, "about," "approximately," or "substantially" preceding a value means +/−10 percent of the stated value.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

Modifications are possible in the described examples, and other examples are possible within the scope of the claims.
3300-55600

What is claimed is:

1. An analog-to-digital converter (ADC) operable to convert an analog input signal to an output signal at an output of the ADC, the ADC comprising:
    multiple sub-ADCs coupled in parallel, each of the multiple sub-ADCs coupled to the output of the ADC and operable to receive the analog input signal; and
    wherein, the ADC is configured to operate the sub-ADCs in a consecutive operation loop including:
        a transition phase in which the ADC operates each of the sub-ADCs sequentially for a first number of sequences;
        an estimation phase in which the ADC operates each of the sub-ADCs sequentially for a second number of sequences following the first number of sequences; and
        a randomization phase in which the ADC operates subsets of the sub-ADCs for a third number of sequences following the second number of sequences.

2. The ADC of claim 1, wherein the ADC is configured to determine a random number, and wherein the random number defines the third number.

3. The ADC of claim 2, wherein the random number is a constrained random number, and wherein the ADC is configured to:
    select the random number from an index of values; and
    remove the random number from the index prior to a next selection from the index of values being performed in a subsequently iteration of the consecutive operation loop.

4. The ADC of claim 3, wherein the ADC is configured to return to the transition phase from the randomization phase in a consecutive operation loop until no values remain in the index of values.

5. The ADC of claim 3, wherein the ADC is configured to select the sub-ADCs for operation during the transition phase and the estimation phase in a periodic nature, and shift a phase of a signal received by the ADC by an amount equal to the random number during the randomization phase.

6. The ADC of claim 1, wherein the ADC is configured to not change which of the sub-ADCs are included in the subsets of the sub-ADCs for the third number of sequences.

7. The ADC of claim 1, wherein the ADC is configured to change which of the sub-ADCs are included in the subsets of the sub-ADCs at least once during the third number of sequences.

8. A method for operating an analog to digital converter (ADC), comprising:
    controlling multiple parallel-coupled sub-ADCs to operate sequentially and periodically for a first number of sequences; and
    controlling subsets of the sub-ADCs to operate for a second number of sequences, the second number being a randomly selected number.

9. The method of claim 8, comprising:
    selecting the randomly selected number from an index of values, wherein the randomly selected number is a constrained random number; and
    removing the randomly selected number from the index of values following the second number of sequences.

10. The method of claim 9, comprising looping between controlling all of the ADCs to operate sequentially and periodically, and controlling the subsets of the ADCs to operate sequentially until no values remain in the index of values.

11. The method of claim 8, comprising maintaining the subsets of the ADCs unchanged for the second number of sequences.

12. The method of claim 8, comprising changing the subsets of the ADCs at least once during the second number of sequences.

13. The method of claim 8, further comprising:
    determining IL mismatch information during the at least some of the first number of sequences and the second number of sequences;
    determining an estimate of an IL mismatch of the ADCs; and
    determining IL mismatch correction coefficients according to the estimate of the IL mismatch.

14. The method of claim 13, further comprising applying the IL mismatch correction coefficients to at least some of the ADCs.

15. The method of claim 8, comprising shifting a phase of a signal received by at least some of the ADCs during the second number of sequences from that received by at least some of the ADCs during the first number of sequences by an amount equal to the randomly selected number.

16. A receiver comprising:
    an input;
    an output;
    a time-interleaved analog-to-digital converter (ADC) having an input coupled to the input of the receiver and an output coupled to the output of the receiver, the time-interleaved ADC including multiple sub-ADCs coupled in parallel; and
    wherein the time-interleaved ADC is configured to:
        control the sub-ADCs to operate sequentially and periodically in a periodic phase for a first number of sequences; and
        control a subset of the sub-ADCs to operate in a randomization phase for a second number of sequences, the second number being a randomly selected number.

17. The receiver of claim 16, wherein the time-interleaved ADC is configured to:
    select the randomly selected number from an index of values, wherein the randomly selected number is a constrained random number; and
    remove the randomly selected number from the index of values following the second number of sequences.

18. The receiver of claim 17, wherein the time-interleaved ADC is configured to loop between the periodic phase and the randomization phase until no values remain in the index of values.

19. The receiver of claim 16, wherein the time-interleaved ADC is configured to maintain the subset of the ADCs unchanged for the second number of sequences.

20. The receiver of claim 16, wherein the time-interleaved ADC is configured to change the subset of the ADCs at least once during the second number of sequences.

* * * * *